United States Patent
Kim et al.

(12)
(10) Patent No.: US 6,195,323 B1
(45) Date of Patent: Feb. 27, 2001

(54) DATA CODING METHOD OF AN OPTICAL DISK

(75) Inventors: Myoung-june Kim, Suwon; Kyung-geun Lee, Seoul; Seung-tae Jung, Seongnam, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/081,025

(22) Filed: May 19, 1998

(30) Foreign Application Priority Data

Dec. 19, 1997 (KR) .................................................. 97-70658

(51) Int. Cl.$^7$ ....................................................... G11B 7/00
(52) U.S. Cl. ............................................ 369/59; 369/275.3
(58) Field of Search .................................. 369/124.02, 59, 369/48, 275.3, 47, 58, 54

(56) References Cited

U.S. PATENT DOCUMENTS

| | | | | |
|---|---|---|---|---|
| 5,446,717 | * | 8/1995 | Kobayashi | 369/124.2 |
| 5,761,172 | * | 6/1998 | Minemura et al. | 369/59 |
| 5,796,692 | * | 8/1998 | Hosoya | 369/124.2 |
| 6,023,447 | * | 2/2000 | Kobayashi | 369/124.2 |

FOREIGN PATENT DOCUMENTS

| | | |
|---|---|---|
| 0 376 626 | 7/1990 | (EP) . |
| 0 650 263 | 4/1995 | (EP) . |
| 59-207433 | 11/1984 | (JP) . |
| 63-214919 | 9/1988 | (JP) . |
| 2-172039 | 7/1990 | (JP) . |
| 2-203424 | 8/1990 | (JP) . |
| 5-62200 | 3/1993 | (JP) . |
| 8-69626 | 3/1996 | (JP) . |
| 8-235593 | 9/1996 | (JP) . |
| 9-148936 | 6/1997 | (JP) . |
| 9-326704 | 12/1997 | (JP) . |

OTHER PUBLICATIONS

Patent Abstracts of Japan, vol. 009, No. 076 (P–346), Apr. 5, 1985 & JP 59 207433A, Nov. 24, 1984.

* cited by examiner

Primary Examiner—Nabil Hindi
(74) Attorney, Agent, or Firm—Staas & Halsey LLP

(57) ABSTRACT

A data coding method of an optical disk having a dual spiral track including a first spiral and a second spiral which are disposed adjacent to each other and on which information can be simultaneously recorded. The data coding method includes the steps of utilizing a quaternary form depending on whether pits are formed or not on the first spiral and the second spiral, respectively, and using a modulated code for 8 bit—8 bit nonreturn-to-zero-inverted (NRZI) recording; and converting the 8-bit units into 10 channel bit units by adding 2 channel merging bits between the 8-bit units, and using a run-length-limited (RLL) code in which the minimum run of '0' data bits is 2.

15 Claims, 3 Drawing Sheets

1  1

DATA CODING METHOD OF AN OPTICAL DISK

BACKGROUND OF THE INVENTION

1. Field of the Invention

The present invention relates to an improved data coding method of an optical disk for realizing a high data transfer rate and a high density by simultaneously reproducing dual spiral tracks with one beam of light.

2. Description of the Related Art

In general, a read only optical disk such as a CD-ROM, a DVD-ROM, etc., has recorded information on a single spiral track 1 on a recording surface thereof, as shown in FIG. 1. The information signals are recorded in binary form depending on whether a pit 3 is formed or not and the length of each one of the pits 3 formed in a depressed form to have a predetermined depth.

In other words, '0' and '1' states are classified by the difference in the intensity of diffracted beams between portions at the ends of each pit 3 and other portions, detected by an optical pickup (not shown), and the information signals are recorded or reproduced by coding or decoding those states.

In the optical disk as described above, since the size of a disk, the distance between neighboring tracks depending on the light spot size focused on the track, the minimum length of the pits, etc., are limited, there is a limit to increasing recording density.

In addition, there is a disadvantage to reading the optical disk in that the read time is long. When a CD-ROM having a storage capacity of 0.65 giga bytes per side is read at a linear speed of 28.8 m/s and a clock frequency of about 100 MHz, it takes more than 3 minutes. When a DVD-ROM having a storage capacity of 4.7 giga bytes per side is read at a linear speed of 6.98 m/s and a clock frequency of about 58.36 MHz, it takes more than 22 minutes.

The inventors have discovered the above-noted problems and have developed solutions to these problems.

SUMMARY OF THE INVENTION

It is an object of the present invention to provide a data coding method of an optical disk for enhancing information recording density in a read only optical disk having a dual spiral track.

It is another object of the present invention to provide a data coding method of a read only optical disk for increasing a reading speed of a read only optical disk having a dual spiral track.

Additional objects and advantages of the invention will be set forth in part in the description which follows and, in part, will be obvious from the description, or may be learned by practice of the invention.

Accordingly, to achieve the above and other objects of the present invention, there is provided a data coding method of an optical disk having a dual spiral track including a first spiral and a second spiral which are disposed adjacent to each other and on which information can be simultaneously recorded, wherein the data coding method includes the steps of utilizing a quaternary form depending on whether each respective pit is formed or not on the first spiral and the second spiral and using a modulated code for 8 bit—8 bit nonreturn-to-zero-inverted (NRZI) recording, wherein a run-length-limited (RLL) code in which the minimum run of '0' data bits is 2 is included in each of the 8-bit NRZI units; and converting 8 bit NRZI units into 10 channel bit units by adding 2 channel merging bits between the 8 bit NRZI units.

BRIEF DESCRIPTION OF THE DRAWINGS

The above and other objects and advantages of the present invention will become more apparent by describing in detail a preferred embodiment thereof with reference to the attached drawings in which.

DESCRIPTION OF THE PREFERRED EMBODIMENT

Figure 1:
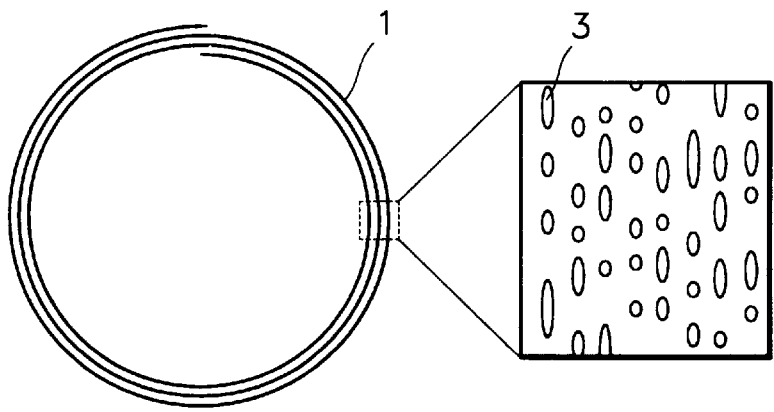
FIG. 1 is a schematic view illustrating a part of a single spiral track of a conventional read only optical disk.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
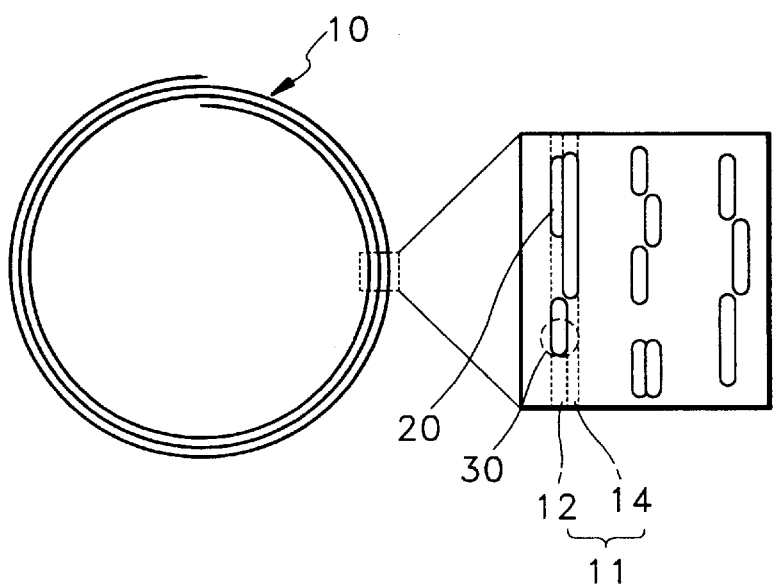
FIG. 2 is a schematic view illustrating a part of a dual spiral track of an optical disk for explanation of a data coding method of an optical disk according to an embodiment of the present invention.
Figure 3A:
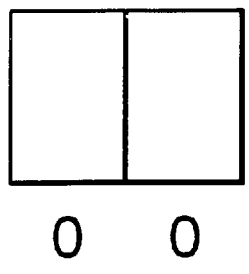
FIGS. 3A through 3D are schematic diagrams each illustrating recording pits of a part of the optical disk shown in FIG. 2 illuminated by a light beam.
Figure 3B:
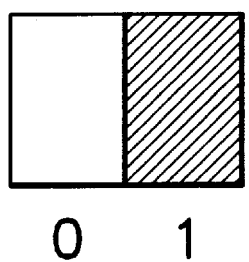
Figure 3C:
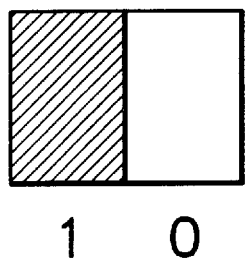
Figure 3D:
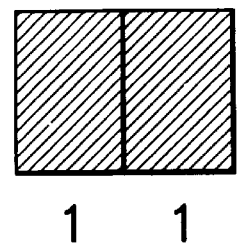

FIG. 2 shows a read only optical disk 10 having an improved track structure with a dual spiral track 11. The read only optical disk 10 has the dual spiral track 11 readable with a single beam of light.

The dual spiral track 11, on which information signals are formed, includes a first spiral 12 and a second spiral 14 disposed adjacent to each other, is formed on a recording surface of the read only optical disk 10. The information signals are formed in a depressed form to have a predetermined depth and are represented by a plurality of pits 20 of various lengths, while the information signals are recoded depending on the dispositional relationship of the pits 20 formed on the first spiral 12 and the second spiral 14. In the optical disk 10, the information signals can be simultaneously reproduced from the first spiral 12 and the second spiral 14 utilizing a light spot 30 illuminated by one optical pickup (not shown). Here, since the recording of the information pits 20 of the first spiral 12 and the second spiral 14 can be performed by a conventional dual beam recorder (not shown), detailed descriptions thereof are omitted.

With one optical pickup, quaternary data of four states, '00', '01', '10', and '11', as shown in FIGS. 3A through 3D can be obtained by utilizing two states classified by the difference in the intensity of diffracted beams between portions at both ends of each pit and the other portions in the first spiral and another two states in the second spiral. With a coding method utilizing the quaternary data, high density recording can be achieved by recording quaternary data.

The coding method uses a processor (not shown) which performs processing subsequent to the reading of the data bits which are classified by the difference in the intensity of diffracted beams between portions at both ends of each pit and the other portions in the first spiral and in the second spiral.

The coding method of an optical disk according to the present invention, utilizes quaternary and modulated code for 8 bit—8 bit nonreturn-to-zero-inverted (NRZI) recording which modulates 8 bit input data into another 8 bit data. In the recording method utilizing the NRZI modulated code, the modulated code is modulated from a low value to a high value or from a high value to a low value when an input data bit is '1', and the modulated signal is recorded on the optical disk 11. Here, the data bit '1' means that the above four states '00', '01', '10', and '11' each are continued by the other one state.

In the input data bits, to decrease the occurrence of errors when '1' data bits are continuously input and '0' data bits are continuously disposed within one channel, a run-length-limited (RLL) code in which at least one of '1' data bit is included in each channel bit and a minimum run of two '0' data bits is used.

Figure 4:
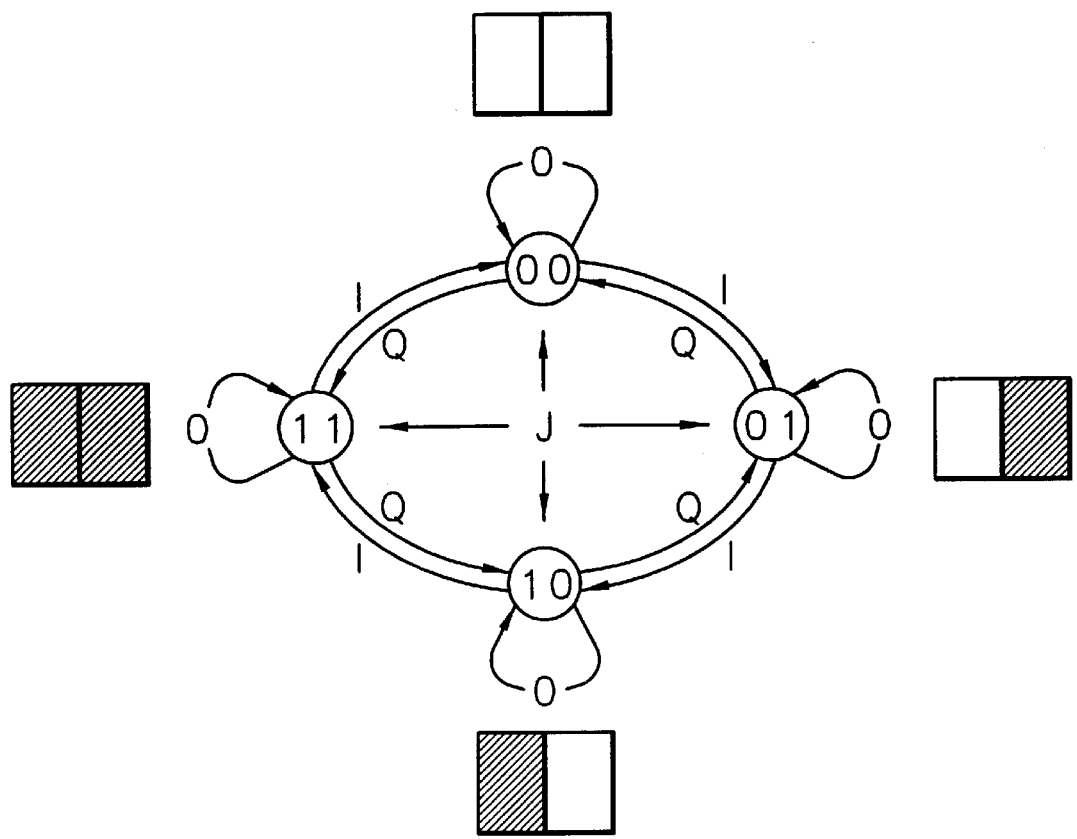
FIG. 4 is a diagram illustrating data states recorded on the optical disk shown in FIG. 2.

When the NRZI modulated code is recorded, transitions from the four states '00', '01', '10', and '11' may be 0, 1, J, or Q, as shown in FIG. 4.

That is, when the four states '00', '01', '10' and '11' are disposed clockwise. The transition 0 represents that the state of each recording data is not changed. In this case, the NRZI modulated code maintains a previous state '00', '01', '10', or '11'.

The transitions 1, Q and J represent that the state of a recording pit of each is changed clockwise, counterclockwise, or in diagonal direction, respectively. In the cases of the transitions 1, J and Q, when the front end of the NRZI modulated code has a high value, it is converted into a low value, and when the front end of the NRZI modulated code has a low value, it is converted into a high value.

The number of code words of the NRZI modulated code which has the states as mentioned above is 267, as shown in Table 1.

The RLL code is included in the NRZI modulated code. According to the RLL code standard, one to three '1' data bits can be included in the above 8 bits.

When one '1' data bit is included in the 8 bits, 24 codes, as transitions 1, J and Q, are possible with respect to 8 codes.

Also, when two '1' data bits are included in the 8 bits while satisfying the condition in which at least two '0' data bits must exist between '1' data bits, 135 codes, as transitions (1, 1), (1, J), (1, Q), (J, 1), (J, J), (J, Q), (Q, 1), (Q, J) and (Q, Q), are possible with respect to 15 codes.

Also, when three '1' data bits are included in the 8 bits while satisfying the condition of at least two '0' data bits between '1' data bits, 108 codes, as transitions (1, 1, 1), (1, 1, J), (1, 1, Q), (1J, 1), (1, J, J), (1, J, Q), (1, Q, 1), (1, Q, J), (1, Q, Q), (J1, 1), (J, 1, J), (J, 1, Q), (J, J, 1), (J, J, J), (J, J, Q), (J, Q, 1), (J, Q, J), (J, Q, Q), (Q, 1, 1), (Q, 1, J), (Q, 1, Q), (Q, J, 1), (Q, J, J), (Q, J, Q), (Q, Q, 1), (Q, Q, J) and (Q, Q, Q), are possible with respect to 4 codes.

TABLE 1

| | B1 | B2 | B3 | B4 | B5 | B6 | B7 | B8 | No. of Codes |
|---|---|---|---|---|---|---|---|---|---|
| 1 | 1 | 0 | 0 | 0 | 0 | 0 | 0 | 0 | 24 codes |
| 2 | 0 | 1 | 0 | 0 | 0 | 0 | 0 | 0 | |
| 3 | 0 | 0 | 1 | 0 | 0 | 0 | 0 | 0 | |
| 4 | 0 | 0 | 0 | 1 | 0 | 0 | 0 | 0 | |
| 5 | 0 | 0 | 0 | 0 | 1 | 0 | 0 | 0 | |
| 6 | 0 | 0 | 0 | 0 | 0 | 1 | 0 | 0 | |
| 7 | 0 | 0 | 0 | 0 | 0 | 0 | 1 | 0 | |
| 8 | 0 | 0 | 0 | 0 | 0 | 0 | 0 | 1 | |
| 9 | 1 | 0 | 0 | 1 | 0 | 0 | 0 | 0 | 135 codes |
| 10 | 1 | 0 | 0 | 0 | 1 | 0 | 0 | 0 | |
| 11 | 1 | 0 | 0 | 0 | 0 | 1 | 0 | 0 | |
| 12 | 1 | 0 | 0 | 0 | 0 | 0 | 1 | 0 | |
| 13 | 1 | 0 | 0 | 0 | 0 | 0 | 0 | 1 | |
| 14 | 0 | 1 | 0 | 0 | 1 | 0 | 0 | 0 | |
| 15 | 0 | 1 | 0 | 0 | 0 | 1 | 0 | 0 | |
| 16 | 0 | 1 | 0 | 0 | 0 | 0 | 1 | 0 | |
| 17 | 0 | 1 | 0 | 0 | 0 | 0 | 0 | 1 | |
| 18 | 0 | 0 | 1 | 0 | 0 | 1 | 0 | 0 | |
| 19 | 0 | 0 | 1 | 0 | 0 | 0 | 1 | 0 | |
| 20 | 0 | 0 | 1 | 0 | 0 | 0 | 0 | 1 | |
| 21 | 0 | 0 | 0 | 1 | 0 | 0 | 1 | 0 | |
| 22 | 0 | 0 | 0 | 1 | 0 | 0 | 0 | 1 | |
| 23 | 0 | 0 | 0 | 0 | 1 | 0 | 0 | 1 | |
| 24 | 1 | 0 | 0 | 1 | 0 | 0 | 1 | 0 | 108 codes |
| 25 | 1 | 0 | 0 | 1 | 0 | 0 | 0 | 1 | |
| 26 | 1 | 0 | 0 | 0 | 1 | 0 | 0 | 1 | |
| 27 | 0 | 1 | 0 | 0 | 1 | 0 | 0 | 1 | |
| Total | | | | | | | | | 267 codes |

Among the total 267 modulated code words above utilized in data recording are 256 codes corresponding to codes to be made by 8 bits.

In the case that data are recorded on an optical disk by using the NRZI modulated code, since '1' data bits may exist both at the rear end of a modulated code and at the front end of the following modulated code of the modulated code in the stream of the modulated codes, there is a possibility that the above-mentioned RLL code standard is not satisfied. Thus, 2 channel merging bits are added between 8 bit codes in the coding method, and therefore, data are processed in the form of 10 channel bits.

Accordingly, the present invention can enhance the recording density since the above NRZI modulated code are recorded by 2 pit signals of 4 states which can be realized by a dual spiral track and recording signals of 10 channel bits having the above NRZI modulated code are generated in accordance with the above-described coding method.

In addition, theoretically speaking, since the length of the track required to record a channel bit code is reduced to half of that required in binary, the speed of reproducing data recorded on an optical disk is enhanced by about twice that of binary without increasing the revolution speed of the optical disk when data recorded on an optical disk is reproduced.

What is claimed is:

1. A data coding method of an optical disk having a dual spiral track including a first spiral and a second spiral which are disposed adjacent to each other and on which information is simultaneously recorded, wherein the data coding method includes the steps of:

utilizing a quaternary form depending on whether respective pits are formed on the first spiral and the second spiral, respectively, and using a modulated code for 8 bit—8 bit nonreturn-to-zero-inverted (NRZI) recording, wherein a run-length-limited (RLL) code in which a minimum run of '0' data bits is 2 is included in each of the 8-bit NRZI units; and converting the 8-bit NRZI units into 10 channel bit units by adding 2 channel merging bits between the 8-bit NRZI units.

2. The data coding method of an optical disk as claimed in claim 1, wherein the modulated code for NRZI recording includes 267 code words and uses 256 code words among the 267 code words.

3. A data coding method of an optical disk, comprising:

forming a track having first and second spirals on a surface of the optical disk;

using a quaternary form in accordance with both the first and second spirals to form data pits within both the first and second spirals, wherein using said quaternary form comprises:

converting 8-bit units of the data pits of both the first and second spirals to 8-bit nonreturn-to-zero-inverted (NRZI) units using a modulated code; and recording the data pits within the first and second spirals based upon the 8-bit NRZI units;

the data coding method further comprising the step of adding 2 channel merging bits between the 8-bit NRZI units to convert the 8-bits NRZI units into 10-channel bit units.

4. The data coding method as claimed in claim 3, wherein a run-length limited code in which a minimum run of '0' data bits is 2 is included in each of the 8-bit NRZI units.

5. The data coding method as claimed in claim 3, wherein two sets of two states result in the quaternary form, said two states being determined by a difference in intensity of diffracted light beams between portions at both ends of each data pit, and the two sets are of the first and second spirals.

6. The data coding method as claimed in claim 5, wherein an input data bit '1' indicates that the four states '00', '01', '10' and '11' each are continued by the other one state.

7. The data coding method as claimed in claim 3, wherein the modulated code is modulated from a low value to a high value or from a high value to a low value in response to an input data bit is '1'.

8. The data coding method as claimed in claim 3, wherein a transition data bit '0' indicates that a state of recording data represented by the data pits is unchanged.

9. The data coding method as claimed in claim 3, wherein a number of code words of the 8-bit NRZI units is 267.

10. The data coding method as claimed in claim 4, wherein a maximum number of '1' data bits of each 8-bit NRZI unit is 3.

11. The data coding method as claimed in claim 4, wherein when one '1' data bit is included in the 8-bit NRZI unit, 24 codes as first through third transitions are possible with respect to 8 codes.

12. The data coding method as claimed in claim 4, wherein when two '1' data bits are included in the 8-bit NRZI unit and at least two '0' data bits exist between the '1' data bits, 135 codes as first through ninth transitions are possible with respect to 15 codes.

13. The data coding method as claimed in claim 4, wherein when two '1' data bits are included in the 8-bit NRZI unit and at least two '0' data bits exist between the '1' data bits, 108 codes as first through twenty-seventh transitions are possible with respect to 4 codes.

14. A data coding method of an optical disk, comprising:

forming a track having data pits arranged in first and second spirals on a surface of the optical disk; and associating the data pits in the first spiral and the data pits in the second spiral to form digital data wherein said first pits represent more significant bits of said digital data and said second pits represent less significant bits of said digital data.

15. A data coding method as claimed in claim 14, further comprising:

providing a pit free space between adjacent convolutions of said spiral track.

* * * * *